(12) United States Patent (10) Patent No.: US 9,176,178 B2
Yu et al. (45) Date of Patent: Nov. 3, 2015

(54) BATTERY SIMULATION CIRCUIT

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Qi-Long Yu, Shenzhen (CN); Tsung-Jen Chuang, New Taipei (TW); Jun Zhang, Shenzhen (CN); Shih-Fang Wong, New Taipei (TW); Jun-Wei Zhang, Shenzhen (CN); Jian-Jun Zhou, Shenzhen (CN)

(73) Assignees: Fu Tai Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 320 days.

(21) Appl. No.: 13/894,450

(22) Filed: May 15, 2013

(65) Prior Publication Data

US 2013/0307572 A1 Nov. 21, 2013

(30) Foreign Application Priority Data

May 17, 2012 (CN) .......................... 2012 1 0153272

(51) Int. Cl.
*G01R 31/00* (2006.01)
*G01R 31/28* (2006.01)

(52) U.S. Cl.
CPC ............ *G01R 31/00* (2013.01); *G01R 31/2848* (2013.01)

(58) Field of Classification Search
CPC ............................. G01R 31/00; G01R 31/2848
USPC ........................ 324/500, 750.03, 537, 750.01, 324/427–444, 425, 415, 600; 320/118, 104, 320/434, 132–136, 148, 151–165; 361/77–88
See application file for complete search history.

(56) References Cited

U.S. PATENT DOCUMENTS 7,145,313 B2 * 12/2006 Geren et al. .................. 320/134
8,723,678 B2 * 5/2014 Ju et al. ....................... 340/636.1

* cited by examiner

*Primary Examiner* — Melissa Koval
*Assistant Examiner* — Trung Nguyen
(74) *Attorney, Agent, or Firm* — Novak Druce Connolly Bove + Quigg LLP

(57) ABSTRACT

A battery simulation circuit simulates a rechargeable battery. The battery simulation circuit includes an integrated amplifier, a voltage adjustment unit, a current limitation unit, and a feedback unit. The voltage adjustment unit provides a reference voltage for the integrated amplifier; the current limitation unit provides a reference current for the integrated amplifier and the feedback unit provides a negative feedback signal for the integrated amplifier to control the integrated amplifier working in a linear state. The integrated amplifier outputs an output signal according to the reference voltage and the reference current; the battery simulation circuit supplies power for an electronic device. When the output terminal is connected to a DC power source and a voltage of the DC power source is greater than the output voltage of the output terminal, the battery simulation circuit simulates a battery being recharged by the DC power source via the output terminal.

20 Claims, 2 Drawing Sheets

BATTERY SIMULATION CIRCUIT

BACKGROUND

1. Technical Field

The present disclosure relates to a battery simulation circuit, and particularly to a circuit simulating a rechargeable battery.

2. Description of Related Art

An electronic device may include a lithium-ion battery as a power source. A manufacturing company needs to test a plurality of functions of the electronic device. However, the functions test takes long time, thus it could reduce the battery life of the battery in the electronic device.

Therefore, what is needed is a means to overcome the above described shortcoming.

BRIEF DESCRIPTION OF THE DRAWINGS

The components in the drawings are not necessarily drawn to scale, the emphasis instead being placed upon clearly illustrating the principles of at least one embodiment. In the drawings, like reference numerals designate corresponding parts throughout the various views.

DETAILED DESCRIPTION

Reference will be made to the drawings to describe various embodiments.

Figure 1:
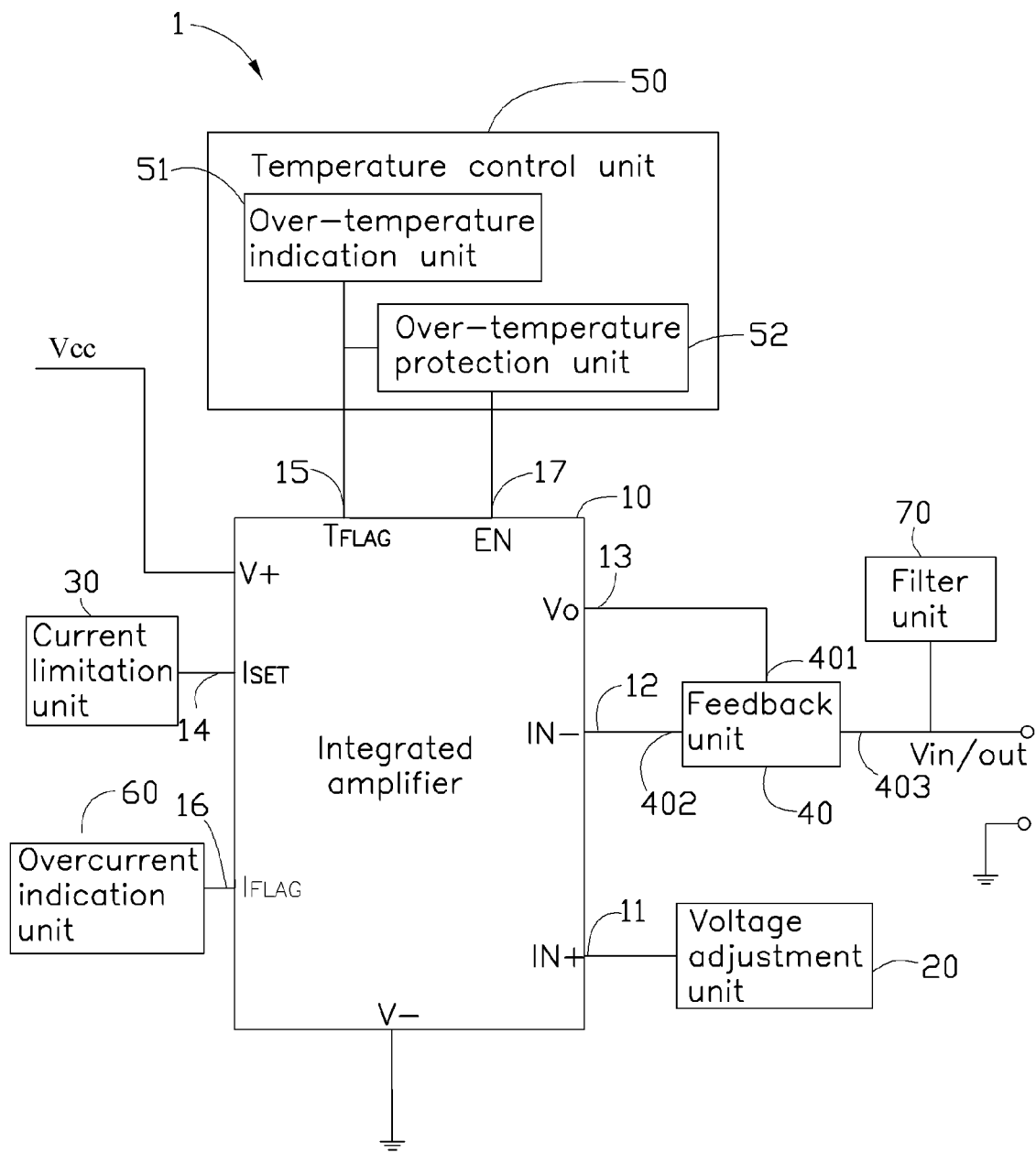
FIG. 1 is a block diagram of a battery simulation circuit according to an exemplary embodiment of the present disclosure.

FIG. 1 is a block diagram of a battery simulation circuit 1 according to an exemplary embodiment of the present disclosure. The battery simulation circuit 1 simulates a battery supplying power for an electronic device, and can also simulate a rechargeable battery when testing the ability of the electronic device to recharge a battery. The battery simulation circuit 1 includes an input/output terminal Vin/out to connect to the electronic device, and further includes an integrated amplifier 10, a voltage adjustment unit 20, a current limitation unit 30, a feedback unit 40, a temperature control unit 50, and an overcurrent indication unit 60. Preferably, the battery simulation circuit 1 further includes a filter unit 70 to filter a signal via the input/output terminal Vin/out. In the embodiment, the integrated amplifier 10 is an OPA567 made by TI.

The voltage adjustment unit 20 provides a reference voltage U1 to the integrated amplifier 10. The current limitation unit 30 provides a reference current I1 to the integrated amplifier 10. The feedback unit 40 provides a negative feedback signal for the integrated amplifier 10. The temperature control unit 50 indicates whether a temperature of the integrated amplifier 10 is greater than a predetermined temperature (e.g., user defined) according to the simulated battery. The overcurrent indication unit 60 indicates whether an output signal of the integrated amplifier 10 is greater than a predetermined current (e.g., user defined) according to the simulated battery. The filter unit 70 filters the signal via the input/output terminal Vin/out.

The integrated amplifier 10 is electrically connected to a power source Vcc via a power pin "V+" and grounded via a ground pin "V−". The integrated amplifier 10 further includes a non-inverting input pin 11, an inverting input pin 12, an input/output pin 13, a current limitation pin 14, a temperature label pin 15, a current label pin 16, and an enable pin 17.

The temperature label pin 15 is connected to the temperature control unit 50 for detecting whether the temperature of the integrated amplifier 10 is greater than the predetermined temperature. The current label pin 16 is connected to the overcurrent indication unit 60 for detecting whether an output current of the input/output pin 16 is greater than the predetermined current. The enable pin 17 receives a logic high signal (e.g., "1") or a logic low signal (e.g., "0") to activate or enable the integrated amplifier 10. In the embodiment, when the enable pin 17 receives a logic high signal, the integrated amplifier 10 works normally, and when the enable pin 17 receives a logic low signal, the integrated amplifier 10 stops working.

The voltage adjustment unit 20 is electrically connected to the non-inverting input pin 11. The current limitation unit 30 is electrically connected to the current limitation pin 14. The integrated amplifier 10 determines voltage and current levels of the output signal according to the reference current I1 and the reference voltage U1. In one embodiment, the output signal includes an output current and an output voltage. The input/output pin 13 is electrically connected to the input/output terminal Vin/out via the feedback unit 40. The feedback unit 40 is also electrically connected to the inverting pin 12. The feedback unit 40 outputs a feedback signal to the inverting pin 12 according to the output signal of the integrated amplifier 10.

The temperature control unit 50 is electrically connected to the temperature label pin 15 for detecting whether the temperature of the integrated amplifier 10 is greater than the predetermined temperature and selectively outputs a logic high signal or a logic low signal to the enable pin 17 according to the detection of the temperature. In more detail, when the temperature of the integrated amplifier 10 is less than the predetermined temperature, the temperature control unit 50 outputs a logic high signal to the enable pin 17, and the integrated amplifier 10 works normally; otherwise, when the temperature of the integrated amplifier 10 is greater than the predetermined temperature, the temperature control unit 50 outputs a logic low signal to the enable pin 17, and the integrated amplifier stops working.

The overcurrent indication unit 60 is electrically connected to the current label pin 16.

Figure 2:
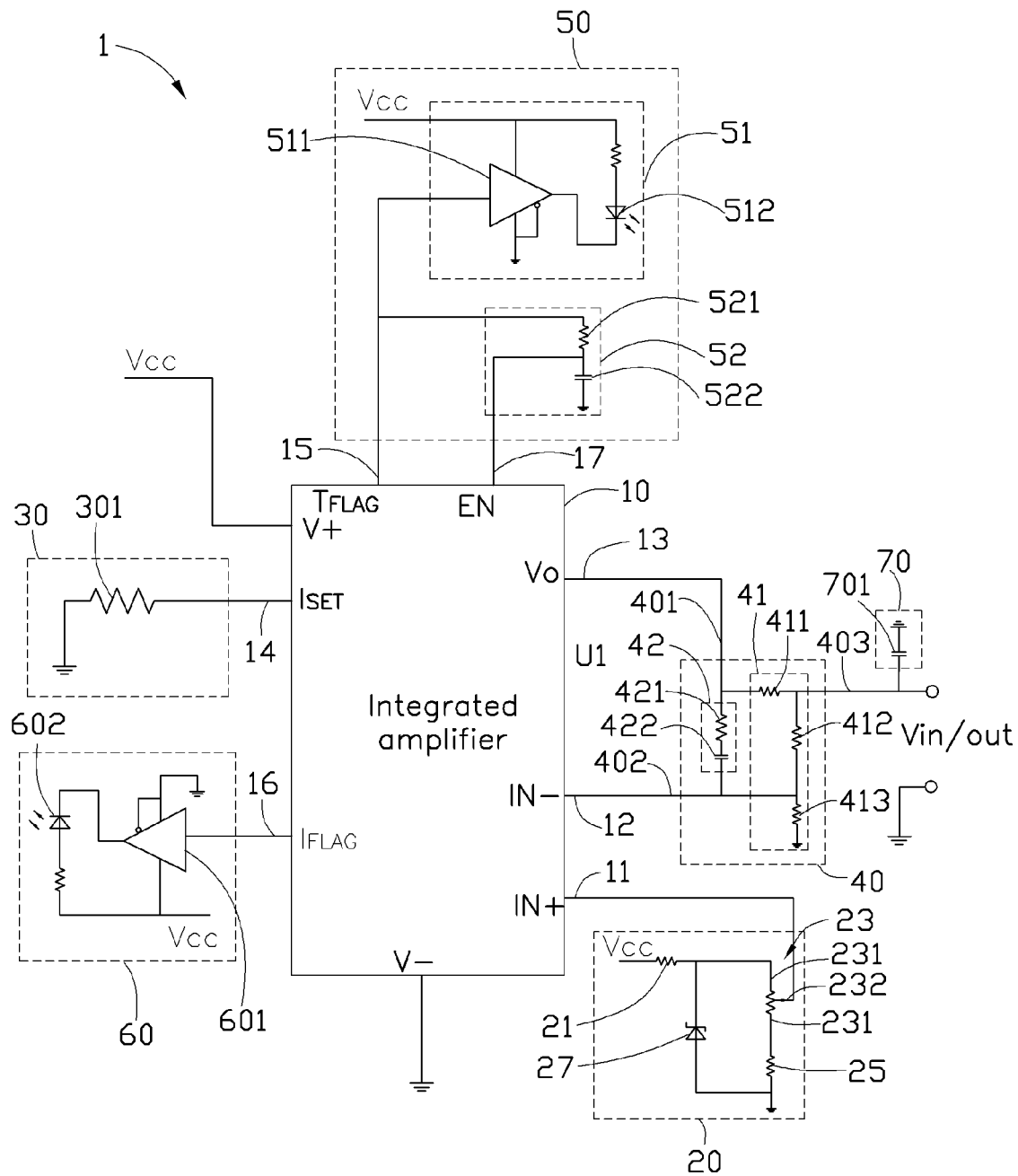
FIG. 2 is a detailed circuit diagram of the battery simulation circuit of FIG. 1.

FIG. 2 shows an exemplary detailed circuit diagram of the battery simulation circuit 1. The current limitation unit 30 includes a current limitation resistor 301, one end of the current limitation resistor 301 is electrically connected to the current limitation pin 14 and the other end of the current limitation resistor 301 is grounded.

The feedback unit 40 includes a feedback signal input terminal 401, a feedback signal output terminal 402, and an output terminal 403. The feedback signal input terminal 401 is electrically connected to the input/output pin 13. The feedback signal output terminal 402 is electrically connected to the inverting pin 12. The output terminal 403 is electrically connected to the input/output terminal Vin/out. The feedback unit 40 includes a feedback branch 41 and a suppression circuit 42. The feedback branch 41 feeds back the output signal to the inverting pin 12. The suppression circuit 42 suppresses a self-excitation signal from the feedback signal input terminal 401.

The feedback branch 41 includes a first divider resistor 411, a second divider resistor 412, and a third divider resistor 413. The first divider resistor 411 is electrically connected to the second divider resistor 412 and to the third divider resistor 413 in series between the feedback signal input terminal 401 and ground. A node between the first divider resistor 411 and the second divider resistor 412 is electrically connected to the output terminal 403. A node between the second resistor 412 and the third resistor 413 is electrically connected to the feedback signal output terminal 402.

The suppression circuit 42 includes a first resistor 421 and a first capacitor 422. The first resistor 421 is electrically connected to the first capacitor 422 between the feedback signal input terminal 401 and the feedback signal output terminal 402.

The voltage adjustment unit 20 includes a bias resistor 21, an adjustable resistor 23, a fourth divider resistor 25, and a zener diode 27. The adjustable resistor 23 includes two conducting ends 231 and a control end 232. A first conducting end 231 is electrically connected to the power source Vcc via the bias resistor 21, and a second conducting end 231 is grounded via the fourth divider resistor 25. The control end 232 is electrically connected to the non-inverting input pin 11. A cathode of the zener diode 27 is electrically connected to the power source Vcc via the bias resistor 21, an anode of the zener diode 27 is grounded.

The temperature control unit 50 includes an over-temperature indication unit 51 and an over-temperature protection unit 52. The over-temperature indication unit 51 detects whether the temperature of the integrated amplifier 10 is greater than the predetermined temperature, and when the temperature of the integrated amplifier 10 is greater than the predetermined temperature, the over-temperature protection unit 52 outputs a logic low signal to control the integrated amplifier 10 to stop working.

The over-temperature indication unit 51 includes a first amplifier 511 and a first LED 512. An input terminal of the first amplifier 511 is electrically connected to the temperature label pin 15. An anode of the first LED 512 is electrically connected to the power source Vcc, and a cathode of the first LED 512 is electrically connected to an output terminal of the first amplifier 511. The first amplifier 511 improves the driving capability in relation to the first LED 512.

The over-temperature protection unit 52 is electrically connected to the temperature label pin 15 and the enable pin 17. The over-temperature protection unit 52 includes a protection resistor 521 and a protection capacitor 522. The temperature label pin 15 is grounded via the protection resistor 521 and the protection capacitor 522 connected in series. A node between the protection resistor 521 and the protection capacitor 522 is electrically connected to the enable pin 17.

The overcurrent indication unit 60 includes a second amplifier 601 and a second LED 602. An anode of the second LED 602 is electrically connected to the power source Vcc, a cathode of the second LED 602 is electrically connected to an output terminal of the second amplifier 601. An input terminal of the second amplifier 601 is electrically connected to the current label pin 16. The second amplifier 601 improves the driving capability in relation to the second LED 602.

The filter unit 70 includes a filter capacitor 701. The output terminal 403 is grounded via the filter capacitor 701.

In operation, the input/output terminal Vin/out connects to the electronic device for providing operation voltage and current to the electronic device. As the feedback unit 40 feeds back the output signal from the input/output pin 13 to the inverting pin 12, the integrated amplifier 10 is working linearly. The non-inverting input pin 11 receives the reference voltage U1, thus a voltage value of the output signal from the input/output pin 13 is U1, and an output voltage Uo of the output terminal 403 satisfies the following formula: Uo=U1*(R2+R3)/R3, where "R2" denotes a resistance value of the second divider resistor 412, and "R3" denotes a resistance value of the third divider resistor 413. A current value of the input/output pin 13 Io satisfies the following formula: Io=α*I1/R4, where "α" denotes an amplification parameter of the integrated amplifier 10, "I1" denotes a value of the reference current, and "R4" denotes a resistance value of the current limitation resistor 301. That is, the battery simulation circuit 1 is capable of supplying power for the electronic device in the same manner as an internal battery when the electronic device is being tested. When the output terminal 403 is connected to a DC power source, and a voltage of the DC power source is greater than the output voltage of the output terminal 403, the battery simulation circuit 1 again simulates a battery in being recharged by a DC power source via the output terminal 403.

In the testing process, when the temperature of the integrated amplifier 10 is less than the predetermined temperature, the temperature label pin 15 outputs a logic high signal (e.g., "1"), and the first LED 512 is not illuminated. The enable pin 17 receives a logic high signal to control the integrated amplifier 10 to work normally. When the temperature of the integrated amplifier 10 is greater than the predetermined temperature, the temperature label pin 15 outputs a logic low signal (e.g., "0"), and the first LED 512 is illuminated. The over-temperature protection unit 52 outputs a logic low signal to the enable pin 17, and the integrated amplifier 10 stops working.

When the current value of the output signal of the input/output pin 13 is less than the predetermined current, the current label pin 16 outputs a logic high signal (e.g., "1"), the second LED 602 is not illuminated; when the current value of the output signal of the input/output pin 13 is greater than the predetermined current, the current label pin 16 outputs a logic low signal (e.g., "0"), and the second LED 602 is illuminated to warn that the current value of the output signal of the input/output pin 13 is greater than the predetermined current.

In another embodiment, when the value of the adjustable resistor 23 is adjusted, the reference voltage U1 is changed, thus voltage value of the output signal of the input/output pin 11 is also changed. That is, the battery simulation circuit 1 is capable of simulating batteries with different rated voltages. When the current limitation resistor 301 is replaced, the current value of the output signal of the input/output pin 11 is also changed, thus the battery simulation circuit 1 is also capable of simulating batteries with different current ratings.

In summary, the battery simulation circuit 1 can be used to replace an actual battery for simulating the supply of power to the electronic device and for testing the battery-recharging abilities of an external DC power source. That is, the useful life of the actual battery is not reduced during the testing period of the electronic device.

It is to be understood that even though numerous characteristics and advantages of the present embodiments have been set forth in the foregoing description, with details of the structures and functions of the embodiments, the disclosure is illustrative only; and changes may be in detail, especially in the matters of arrangement of parts within the principles of the embodiments to the full extent indicated by the broad general meaning of the terms in which the appended claims are expressed.

What is claimed is:

1. A battery simulation circuit, comprising:
an input/output terminal electrically connected to an electronic device;
an integrated amplifier comprising a non-inverting input pin, an inverting pin, an input/output pin, and a current limitation pin;
a voltage adjustment unit electrically connected to the non-inverting input pin to provide a reference voltage to the integrated amplifier;

a current limitation unit electrically connected to the current limitation pin to provide a reference current to the integrated amplifier;

a feedback unit electrically connected to the input/output pin, the inverting pin, and the input/output terminal to provide a negative feedback signal for the integrated amplifier; and wherein the integrated amplifier outputs an output signal according to the reference voltage and the reference current; the battery simulation circuit supplies power for the electronic device; when the output terminal is connected to a DC power source and a voltage of the DC power source is greater than the output voltage of the output terminal, the battery simulation circuit simulates a battery being recharged by the DC power source via the output terminal.

2. The battery simulation circuit of claim 1, wherein the feedback unit comprises a feedback branch and a suppression circuit, the feedback branch feedbacks the output signal to the inverting pin of the integrated amplifier and the suppression circuit suppresses a self-excitation signal of the feedback unit.

3. The battery simulation circuit of claim 2, wherein the feedback branch comprises a first divider resistor, a second divider resistor, and a third divider resistor, the first divider resistor is electrically connected to the second divider resistor and the third divider resistor in series between the input/output pin and the ground, and a node between the first divider resistor and the second divider resistor is electrically connected to the inverting pin.

4. The battery simulation circuit of claim 2, wherein the suppression circuit comprises a first resistor and a first capacitor, and the first resistor is electrically connected to the first capacitor between the input/output pin and the inverting pin.

5. The battery simulation circuit of claim 1, wherein the voltage adjustment unit comprises a bias resistor, an adjustable resistor, a fourth divider resistor, and a zener diode; the adjustable resistor comprises two conducting ends and a control end, a first conducting end is electrically connected to an external power source via the bias resistor, and a second conducting end is grounded via the fourth divider resistor, a cathode of the zener diode is electrically connected to the external power source via the bias resistor, and an anode of the zener diode is grounded.

6. The battery simulation circuit of claim 1, further comprising a temperature control unit detecting whether a temperature of the integrated amplifier is greater than a predetermined temperature.

7. The battery simulation circuit of claim 6, wherein the temperature control unit is electrically connected to a temperature label pin and an enable pin of the integrated amplifier; when a temperature of the integrated amplifier is less than the predetermined temperature, the temperature control unit outputs a first control signal to the enable pin, and the integrated amplifier works normally; when the temperature of the integrated amplifier is greater than the predetermined temperature, the temperature control unit outputs a second control signal to the enable pin, and the integrated amplifier stops working.

8. The battery simulation circuit of claim 7, wherein the temperature control unit comprises an over-temperature indication unit and an over-temperature protection unit, the over-temperature indication unit comprises a first amplifier and a first LED, an input terminal of the first amplifier is electrically connected to the temperature label pin, an anode of the first LED is electrically connected to an external power source, and a cathode of the first LED is electrically connected to an output terminal of the first amplifier, and when the temperature of the integrated amplifier is greater than the predetermined temperature, the first LED is conductive.

9. The battery simulation circuit of claim 8, wherein the over-temperature protection unit comprises a protection resistor and a protection capacitor, the temperature label pin is grounded via the protection resistor and the protection capacitor in series, a node between the protection resistor and the protection capacitor is electrically connected to the enable pin.

10. The battery simulation circuit of claim 1, further comprising an overcurrent indication unit electrically connected to a current label pin of the integrated amplifier, which detects whether an output signal of the integrated amplifier is greater than a predetermined current which is set according to the simulated battery.

11. The battery simulation circuit of claim 10, wherein the overcurrent indication unit comprises a second amplifier and a second LED, an anode of the second LED is electrically connected to an external power source, a cathode of the second LED is electrically connected to an output of the second amplifier, an input terminal of the second amplifier is electrically connected to the current label pin.

12. The battery simulation circuit of claim 1, further comprising a filter unit filtering a signal via the input/output terminal.

13. The battery simulation circuit of claim 12, wherein the filter unit comprises a filter capacitor, and the input/output terminal is grounded via the filter capacitor.

14. A battery simulation circuit, comprising:
an integrated amplifier;
a voltage adjustment unit providing a reference voltage for the integrated amplifier;
a current limitation unit providing a reference current for the integrated amplifier; and
a feedback unit providing a negative feedback signal for the integrated amplifier and the integrated amplifier in linear working state;
wherein the integrated amplifier outputs an output signal according to the reference voltage and the reference current; the battery simulation circuit supplies power for the electronic device; when the output terminal is connected to a DC power source and a voltage of the DC power source is greater than the output voltage of the output terminal, the battery simulation circuit simulates a battery being recharged by the DC power source via the output terminal.

15. The battery simulation circuit of claim 14, wherein the integrated amplifier comprises a non-inverting input pin connected to the voltage adjustment unit, a current limitation pin connected to the current limitation unit, an inverting pin and an input/output pin both connected to the feedback unit.

16. The battery simulation circuit of claim 15, wherein the feedback unit comprises a feedback branch and a suppression circuit, the feedback branch feedbacks the output signal to the inverting pin of the integrated amplifier and the suppression circuit suppresses a self-excitation signal of the feedback unit.

17. The battery simulation circuit of claim 15, further comprising a temperature control unit detecting whether a temperature of the integrated amplifier is greater than a predetermined temperature set according to the simulated battery.

18. The battery simulation circuit of claim 17, wherein the temperature control unit is electrically connected to a temperature label pin and an enable pin of the integrated amplifier; when a temperature of the integrated amplifier is less than the predetermined temperature, the temperature control unit outputs a first control signal to the enable pin, and the integrated amplifier works normally; when the temperature of the integrated amplifier is greater than the predetermined temperature, the temperature control unit outputs a second control signal to the enable pin, and the integrated amplifier stops working.

19. The battery simulation circuit of claim 15, further comprising an overcurrent indication unit electrically connected to a current label pin of the integrated amplifier, which detecting whether an output signal of the integrated amplifier is greater than a predetermined current set according to the simulated battery.

20. The battery simulation circuit of claim 15, further comprising a filter unit filtering a signal via the input/output terminal.

* * * * *